United States Patent
Kim et al.

(10) Patent No.: US 10,042,559 B2
(45) Date of Patent: Aug. 7, 2018

(54) ELECTRONIC DEVICES HAVING SEMICONDUCTOR MEMORY WITH INTERFACE ENHANCEMENT LAYER

(71) Applicant: SK hynix Inc., Icheon-Si (KR)

(72) Inventors: Yang-Kon Kim, Icheon-si (KR);
Guk-Cheon Kim, Icheon-si (KR);
Ku-Youl Jung, Icheon-si (KR);
Jong-Koo Lim, Icheon-si (KR);
Won-Joon Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/419,801

(22) Filed: Jan. 30, 2017

(65) Prior Publication Data
US 2017/0329518 A1    Nov. 16, 2017

(30) Foreign Application Priority Data
May 12, 2016    (KR) .......................... 10-2016-0058277

(51) Int. Cl.
*H01L 43/08* (2006.01)
*H01L 43/10* (2006.01)
*G06F 3/06* (2006.01)

(52) U.S. Cl.
CPC ............ *G06F 3/061* (2013.01); *G06F 3/0655* (2013.01); *G06F 3/0679* (2013.01); *H01L 43/08* (2013.01); *H01L 43/10* (2013.01)

(58) Field of Classification Search
CPC ......... H01L 43/02; H01L 43/08; H01L 43/10; G11C 11/14–11/161
See application file for complete search history.

(56) References Cited

U.S. PATENT DOCUMENTS

| | | | |
|---|---|---|---|
| 2010/0183902 A1* | 7/2010 | Kim ....................... | B82Y 25/00 428/811.1 |
| 2011/0096443 A1 | 4/2011 | Zhang et al. | |
| 2011/0149647 A1 | 6/2011 | Kim et al. | |
| 2012/0063218 A1* | 3/2012 | Huai ....................... | G11C 11/16 365/171 |
| 2013/0187248 A1 | 7/2013 | Kariyada et al. | |
| 2014/0258626 A1* | 9/2014 | Kang .................. | H01L 45/1253 711/125 |

\* cited by examiner

*Primary Examiner* — Allison P Bernstein
(74) *Attorney, Agent, or Firm* — Perkins Coie LLP

(57) ABSTRACT

This technology provides an electronic device. An electronic device in accordance with an implementation of this document may include a semiconductor memory for storing data, and the semiconductor memory may include a free layer having a variable magnetization direction; a pinned layer having a pinned magnetization direction; a tunnel barrier layer interposed between the free layer and the pinned layer; and an interface enhancement layer interposed between the tunnel barrier layer and the pinned layer, wherein the interface enhancement layer may include an Fe-rich first layer; a Co-rich second layer formed over the first layer; and a metal layer formed over the second layer.

15 Claims, 9 Drawing Sheets

ELECTRONIC DEVICES HAVING SEMICONDUCTOR MEMORY WITH INTERFACE ENHANCEMENT LAYER

CROSS-REFERENCE TO RELATED APPLICATION

This patent document claims priority of Korean Patent Application No. 10-2016-0058277, entitled "ELECTRONIC DEVICE" and filed on May 12, 2016, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element.

In one aspect, an electronic device may include a semiconductor memory for storing data, and the semiconductor memory may include a free layer having a variable magnetization direction; a pinned layer having a pinned magnetization direction; a tunnel barrier layer interposed between the free layer and the pinned layer; and an interface enhancement layer interposed between the tunnel barrier layer and the pinned layer, wherein the interface enhancement layer may include an Fe-rich first layer; a Co-rich second layer formed over the first layer; and a metal layer formed over the second layer.

Implementations of the above electronic device may include one or more the following.

The first layer may include an Fe-rich CoFeB alloy. The Fe-rich CoFeB alloy includes an Fe content equal to or more than 35 at %. The second layer may include a Co-rich CoFeB alloy. The Co-rich CoFeB alloy includes a Co content equal to or more than 35 at %. The metal layer may include tantalum (Ta). The first layer and the second layer may further include a non-magnetic material. The non-magnetic material may include one or more of zirconium (Zr), niobium (Nb), molybdenum (Mo), ruthenium, titanium (Ti), hafnium (Hf), vanadium (V), chromium (Cr), aluminum (Al), iridium (Ir) or Rhodium (Rh). The electronic device may further include an under layer formed under the interface enhancement layer or an upper layer formed over the interface enhancement layer or the both.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, an electronic device may include a semiconductor memory, and the semiconductor memory may include a substrate; memory cells formed over the substrate, each memory cell including a magnetic layer and an interface enhancement layer that is in contact with the magnetic layer to enhance a magnetic characteristic of the magnetic layer; and switching elements formed over the substrate and coupled to the memory cells to select or de-select the memory cells, respectively, wherein the interface enhancement layer of each memory cell may include an Fe-rich first layer; a Co-rich second layer formed over the first layer; and a metal layer formed over the second layer.

Implementations of the above electronic device may include one or more the following.

Each memory cell may include a magnetic tunnel junction structure that includes the magnetic layer and the interface enhancement layer. The first layer may include an Fe-rich CoFeB alloy. The Fe-rich CoFeB alloy includes an Fe content equal to or more than 35 at %. The second layer may include a Co-rich CoFeB alloy. The Co-rich CoFeB alloy includes a Co content equal to or more than 35 at %. The metal layer may include tantalum (Ta). The first layer and the second layer may further include a non-magnetic material. The non-magnetic material may include one or more of zirconium (Zr), niobium (Nb), molybdenum (Mo), ruthenium, titanium (Ti), hafnium (Hf), vanadium (V), chromium (Cr), aluminum (Al), iridium (Ir) or Rhodium (Rh).

These and other aspects, implementations and associated advantages are described in greater detail in the drawings, the description and the claims.

DETAILED DESCRIPTION

Figure 1:
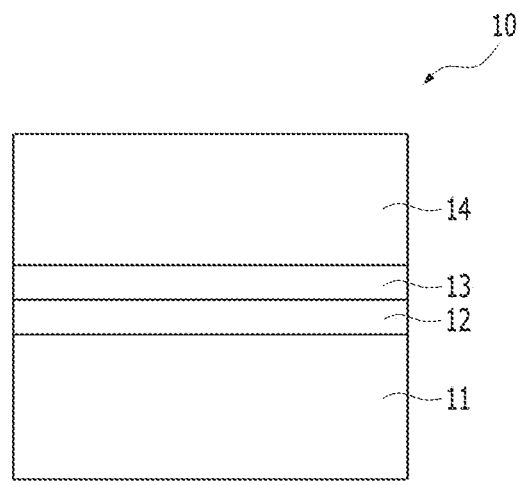
FIG. 1 is a cross-sectional view illustrating an MTJ (Magnetic Tunnel Junction) structure in accordance with a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Following implementations of the present disclosure are to provide a semiconductor memory including a variable resistance element having an improved performance and an electronic device including the same. Here, the variable resistance element may mean an element capable of being switched between different resistance states in response to the applied bias (for example, a current or voltage). Therefore, the variable resistance element having an improved performance may mean the variable resistance element having an improved switching characteristic between different resistance states.

Prior to explaining an implementation of the present disclosure, a variable resistance element in accordance with a comparative example will be described.

FIG. 1 is a cross-sectional view illustrating an MTJ (Magnetic Tunnel Junction) structure of a variable resistance element in accordance with a comparative example.

Referring to FIG. 1, a variable resistance element 10 in accordance with the comparative example may include an MTJ structure including a free layer 11 having a variable magnetization direction that can be changed in its direction, a pinned layer 14 having a pinned magnetization direction that is fixed in its direction, and a tunnel barrier layer 12 interposed between the free layer 11 and the pinned layer 14.

Here, the magnetization direction of the free layer 11 is variable to cause the resistance of the variable resistance element 11 between the layers 11 and 14 across the tunnel barrier layer 12 to have different resistance states with different resistance values depending on the relative direction of the magnetizations of the free layer 11 and the pinned layer 14 so that the free layer 11 may be used to store data according to its magnetization direction with respect to the fixed magnetization direction of the pinned layer 14. In this context, the free layer 11 may be referred to as a storage layer.

The magnetization direction of pinned layer 14 is pinned in a fixed direction and this fixed magnetization direction of the pinned layer 14 may be used as a reference direction to be compared with the magnetization direction of the free layer 11. As such, the pinned layer 14 may be referred to as a reference layer.

The tunnel barrier layer 12 may include an insulating oxide and serve to change the magnetization direction of the free layer 11 by tunneling of electrons.

In some implementations, the variable resistance element 10 may further include additional layer, for example, an interface layer 13 interposed between the tunnel barrier layer 12 and the pinned layer 14 to improve properties of the variable resistance element 10. The interface layer 13 may be formed of or include a single layer containing a metal.

In a variable resistance element 10 where the magnetization directions of the layers 11 and 14 are perpendicular to the layers 11 and 14, it can be difficult to use the interface layer 13 formed of a single layer to simultaneously improve an exchange coupling with the pinned layer 14 while increasing a perpendicular magnetic anisotropy field (Hk) with the tunnel barrier layer 12.

In accordance with an implementation of the present disclosure, a variable resistance element may be structured to include an interface enhancement layer capable of improving an exchange coupling with a pinned layer and increasing a perpendicular magnetic anisotropy with the tunnel barrier layer at the same time.

Figure 2:
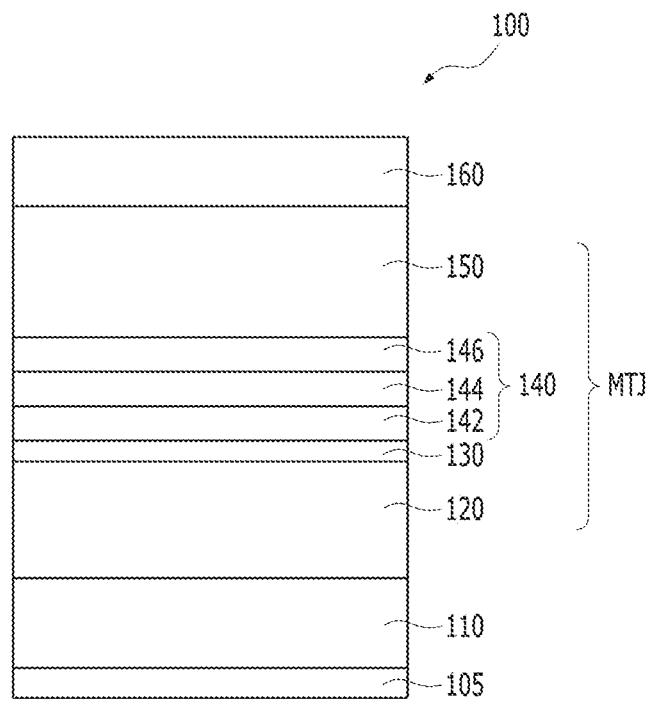
FIG. 2 is a cross-sectional view illustrating a variable resistance element in accordance with an implementation of the present disclosure.

FIG. 2 is a cross-sectional view illustrating an example of a variable resistance element in accordance with an implementation of the present disclosure having such an interface enhancement layer.

Referring to FIG. 2, a variable resistance element 100 in accordance with the implementation may include an MTJ structure including a free layer 120 having a variable magnetization direction, a pinned layer 150 having a pinned magnetization direction, a tunnel barrier layer 130 interposed between the free layer 120 and the pinned layer 150, and an interface enhancement layer 140 interposed between the tunnel barrier layer 130 and the pinned layer 150. Both magnetic layers 120 and 150 have perpendicular magnetizations which are perpendicular to the layers 120 and 150. Notably, the interface enhancement layer 140 is structured as a multi-layer stack structure to both increase an exchange coupling with the pinned layer 150 and improve a perpendicular magnetic anisotropy with the tunnel barrier layer 130. The interface enhancement layer 140 may include, for example, a first layer 142 formed over the tunnel barrier layer 130, a second layer 144 formed over the first layer 142 and a metal layer 146 formed over the second layer 144 which interfaces with the pinned layer 150. Other multi-layer stack structures may also be used to implement the interface enhancement layer 140.

The structure in FIG. 2 is configured to enable the magnetization direction of the free layer 120 to be variable and to change its direction so that the free layer 120 may store data according to its magnetization direction. The magnetization direction of the free layer 120 may be changed by spin transfer torque in some implementations.

The magnetization direction of the pinned layer 150 is pinned in a fixed direction and this fixed magnetization direction of the pinned layer 150 may be used as a reference direction to be compared with the magnetization direction of the free layer 120.

The free layer 120 and the pinned layer 150 may, in some implementations, have their magnetization directions perpendicular to a surface of each layer in the MTJ structure in FIG. 2. For example, as indicated by arrows in drawings, the magnetization direction of the free layer 120 may be changed between a downward direction and an upward direction, and the magnetization direction of the pinned layer 150 may be fixed to a downward direction.

Each of the free layer 120 and the pinned layer 150 may have a single-layered structure or a multi-layered structure including a ferromagnetic material. For example, each of the free layer 120 and the pinned layer 150 may include an alloy of which a main component is Fe, Ni or Co, such as a Co—Fe—B alloy, a Co—Fe—B—X alloy (Here, X may be Al, Si, Ti, V, Cr, Ni, Ga, Ge, Zr, Nb, Mo, Pd, Ag, Hf, Ta, W or Pt.), an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc. Moreover, each of the free layer 120 and the pinned layer 150 may include a stack structure of Co/Pt, or Co/Pd, etc. or an alternate stack structure of a magnetic material and a non-magnetic material.

In response to a voltage or current applied to the variable resistance element 100, the magnetization direction of the free layer 120 may be changed so as to be parallel or anti-parallel to the magnetization direction of the pinned layer 150. When the magnetization directions of the free layer 120 and the pinned layer 150 are parallel to each other, the variable resistance element 100 may be in a low resistance state to store a particular designated digital data bit such as "1". Conversely, when the magnetization directions of the free layer 120 and the pinned layer 150 are anti-parallel to each other, the variable resistance element 100 may be in a high resistance state to store a different designated digital data bit such as "0".

The tunnel barrier layer 130 itself may be an electrical insulator that does not conduct electrons via electrical conduction between the magnetic layers 120 and 150 and may include an insulating oxide, for example, MgO, CaO, SrO, TiO, VO, or NbO, etc. The tunnel barrier layer 130 is structured allow for tunneling of electrons between the free layer 120 and the pinned layer 150 to change the magnetization direction of the free layer 120 by spin torque transfer in a writing operation for changing the resistance state of the variable resistance element 100 when the electric current carrying spin-polarized electrons is at or above a switching current threshold.

In the illustrated 3-layer stack structure for the interface enhancement layer 140 in FIG. 2, the first layer 142 may serve to increase a perpendicular magnetic anisotropy (Hk) at an interface with the adjacent tunnel barrier layer 130.

In some implementations, the first layer 142 may include an Fe-rich CoFeB alloy. In the Fe-rich CoFeB alloy, the content of iron (Fe) may be suitably chosen to improve a perpendicular magnetic anisotropy at an interface with the tunnel barrier layer 130. For example, when the content of boron (B) is from about 10 at % to about 30 at %, the content of iron (Fe) may be equal to or more than about 35 at % and less than about 90 at %. Specifically, when the content of boron (B) is about 20 at %, the content of iron (Fe) may be about 40 at % or more.

By applying the Fe-rich CoFeB alloy as the first layer 142 of the interface enhancement layer 140, it is possible to improve a perpendicular magnetic anisotropy (Hk) at an interface with the tunnel barrier layer 130.

The second layer 144 may serve to increase an exchange coupling with the pinned layer 150.

The second layer 144 may include a Co-rich CoFeB alloy. In the Co-rich CoFeB alloy, the content of cobalt (Co) may be suitably chosen to increase an ferro exchange coupling with the closest Co layer in the pinned layer 150. For example, when the content of boron (B) is from about 10 at % to about 30 at %, the content of cobalt (Co) may be equal to or more than about 35 at % and less than about 90 at %. In some implementations, when the content of boron (B) is about 20 at %, the content of cobalt (Co) may be about 40 at % or more.

For example, in case that the pinned layer 150 has a [Pt/Co]n multi-layered thin film structure, it is possible to increase an ferro exchange coupling with the closest Co layer in the pinned layer 150 by employing the Co-rich CoFeB alloy as the second layer 144 of the interface enhancement layer 140.

The metal layer 146 may serve to improve a crystal growth in the adjacent pinned layer 150 and suppress boron diffusion from the CoFeB layer included in the first layer 142 and the second layer 144. The metal layer 146 may include tantalum (Ta).

In an implementation, each of the first layer 142 and the second layer 144 may include a non-magnetic material doped therein. For example, by doping the non-magnetic material in the Fe-rich CoFeB alloy included in the first layer 142 and the Co-rich CoFeB alloy included in the second layer 144, respectively, saturation magnetization (Ms) can be reduced and thus a perpendicular magnetic anisotropy may be increased.

Examples of the non-magnetic material doped in the first layer 142 and the second layer 144 may include zirconium (Zr), niobium (Nb), molybdenum (Mo), ruthenium (Ru), titanium (Ti), hafnium (Hf), vanadium (V), chromium (Cr), aluminum (Al), iridium (Ir), or rhodium (Rh), etc., but are not limited thereto.

Further, the variable resistance element 100 in accordance with this implementation may further include one or more additional layers performing various functions to improve a characteristic of the MTJ structure. In some implementations, the variable resistance element 100 may include an under layer 110 disposed under the MTJ structure or an upper layer 160 disposed over the MTJ structure, or the both.

The under layer 110 may be used to improve a characteristic, for example, a perpendicular magnetic anisotropy or a crystalline characteristic of the layer disposed over the under layer 110, for example, the free layer 120. The under layer 110 may have a single-layered structure or a multi-layered structure including a conductive material such as a metal, or metal nitride, etc.

The upper layer 160 may be referred to as a capping layer and function as a hard mask for patterning the variable resistance element 100. The upper layer 160 may include various conductive materials such as a metal, etc. For example, the upper layer 160 may be formed of or include a metallic material having few pin holes in the layer and high resistance to a wet or dry etch. For example, the upper layer 160 may include a noble metal such as ruthenium (Ru).

In some implementations of the device structure in FIG. 2, one or more additional layers may be included to the variable resistance element 100. For example, in addition to the layers shown in the example in FIG. 2, the variable resistance element 100 may further include a buffer layer, an exchange coupling layer, or a magnetic correction layer, etc.

For example, the buffer layer may be disposed on a lower electrode 105 and may include a metal, an alloy, or oxide. The buffer layer may be formed of or include a material having a superior matching for the lower electrode 105 in order to overcome inconsistency of the lattice constants between the lower electrode 105 and the under layer 110. For example, when the under layer is formed of or includes TiN, the buffer layer may be formed of or include Ta having a superior matching for TiN.

In an implementation of the device structure in FIG. 2 having a magnetic correction layer, the magnetic correction layer may be structured and placed in the variable resistance element 100 to offset or reduce an influence of a stray field generated by the pinned layer 150 to the magnetization of the free layer 120. The influence of the stray filed of the pinned layer 150 on the free layer 120 can produce a undesired bias magnetic field in the free layer 120 Accordingly, the presence of the magnetic correction layer causes this undesired bias magnetic field in the free layer 120 to be reduced. As a result, thermal stability and a magnetic characteristic of the MTJ structure can be improved. The magnetic correction layer may have a magnetization direction opposite to that of the pinned layer 150. Alternatively, the magnetic correction layer may be formed in a region adjacent to the variable resistance element 100 and separately from the variable resistance element 100.

In an implementation of the device structure in FIG. 2 having an exchange coupling layer and a magnetic correction layer, the exchange coupling layer may be interposed between the magnetic correction layer and the pinned layer to provide an interlayer exchange coupling therebetween. The exchange coupling layer may include, for example, a metallic non-magnetic material such as Cr, Ru, Ir, Rh, or others in some implementations.

The layers for the variable resistance element 100 described above may be formed over a growth substrate of a desired semiconductor material. Above the growth substrate, the free layer 120 can be formed under the pinned layer 150 in some implementations and, in some other implementations, the free layer 120 can be formed over the pinned layer 150. For example, the variable resistance element 100 may have a multi-stack structure in which the under layer, the pinned layer, the metal layer, the second layer, the first layer, the tunnel barrier layer, the free layer and the upper layer are sequentially stacked above the growth substrate.

In implementing the interface enhancement layer in FIG. 2, the variable resistance element 100 can include the interface enhancement layer 140 interposed between the tunnel barrier layer 130 and the pinned layer 150 to include the first layer 142 containing the Fe-rich CoFeB layer, etc., the second layer 144 containing the Co-rich CoFeB layer, etc., and the metal layer 146 containing Ta, etc., which are sequentially stacked. The presence of the interface enhancement layer 14 makes it possible to increase an exchange coupling with the pinned layer 150 and improve a perpendicular magnetic anisotropy with the tunnel barrier layer 130.

Moreover, the interface enhancement layer 140 may be structured to allow for improvement in a crystal growth in the pinned layer 150 and to suppress boron diffusion from the CoFeB layer.

In some implementations, by doping a non-magnetic material in the first layer 142 and the second layer 144 included in the interface enhancement layer 140, it is possible to decrease saturation magnetization (Ms) and thus, increase a perpendicular magnetic anisotropy.

The interface enhancement layer 140 including the first layer 142, the second layer 144 and the metal layer 146 which are sequentially stacked may be fabricated by various processes as will be exemplarily described with reference to FIGS. 3 and 4 together with FIG. 2. As a specific example, the first layer 142 may include the Fe-rich CoFeB layer, the second layer 144 may include the Co-rich CoFeB layer, and the metal layer 146 may include tantalum (Ta).

Figure 3A:
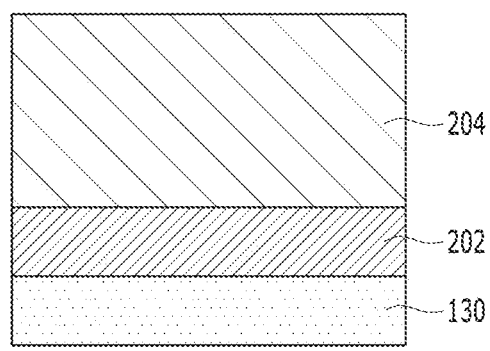
FIG. 3A is a cross-sectional view for explaining an example of a method for fabricating a first layer included in an interface enhancement layer shown in FIG. 2.
Figure 3B:
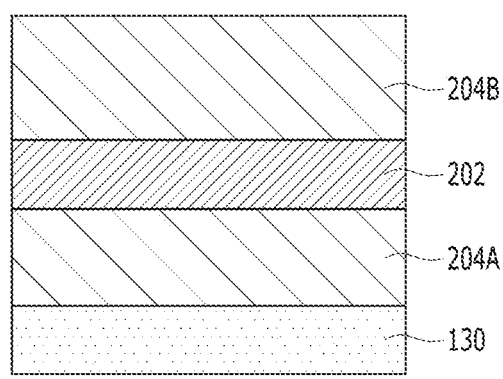
FIG. 3B is a cross-sectional view for explaining another example of a method for fabricating a first layer included in an interface enhancement layer shown in FIG. 2.

FIG. 3A is a cross-sectional view for explaining an example of a method for fabricating a first layer included in an interface enhancement layer shown in FIG. 2. FIG. 3B is a cross-sectional view for explaining another example of a method for fabricating a first layer included in an interface enhancement layer shown in FIG. 2.

Referring to FIG. 3A, an Fe layer 202 may be formed over the tunnel barrier layer 130. Then, a CoFeB layer 204 may be formed over the Fe layer 202. Then, an Fe-rich CoFeB alloy may be formed through a reaction of the Fe layer 202 with the CoFeB layer 204 by performing a heat treatment. Here, a thickness of the Fe layer 202 and a thickness of the CoFeB layer 204 may be controlled such that the Fe content in the Fe-rich CoFeB alloy is equal to or more than about 35 at %, for example, about 40 at % or more.

A sequence of stacking the Fe layer 202 and the CoFeB layer 204 may be reversed. That is, after forming the CoFeB layer 204, the Fe layer 202 may formed over the CoFeB layer 204 and then a heat treatment may be performed.

Referring to FIG. 3B, an Fe-rich CoFeB alloy may be formed by sequentially depositing a first CoFeB layer 204A, an Fe layer 202 and a second CoFeB layer 204B over the tunnel barrier layer 130 and then performing a heat treatment. Here, the sum of a thickness of the first CoFeB layer 204A and a thickness of the second CoFeB layer 204B may be substantially the same as that of the CoFeB layer 204 as shown in FIG. 3A.

In another implementation, although it is not shown, the Fe-rich CoFeB alloy may be formed by performing a heat treatment after a plurality of CoFeB layers and a plurality of Fe layers are alternately deposited.

In further another implementation, although it is not shown, the Fe-rich CoFeB alloy may be formed through a physical deposition process such as a sputtering process by using a CoFeB alloy target.

In still another implementation, although it is not shown, the Fe-rich CoFeB alloy may be formed through a physical deposition process such as a co-sputtering process by using two or more targets.

The second layer 144 including a Co-rich CoFeB alloy may be formed over the first layer 142 including the Fe-rich CoFeB alloy.

Figure 4A:
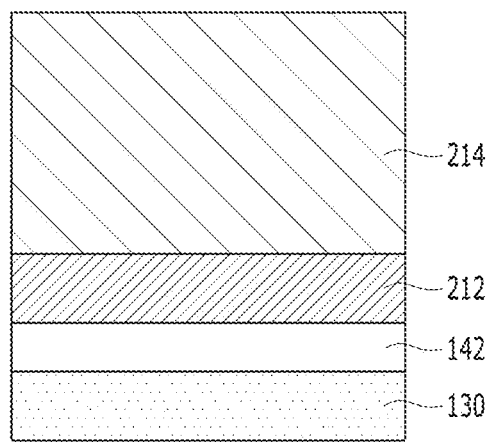
FIG. 4A is a cross-sectional view for explaining an example of a method for fabricating a second layer included in an interface enhancement layer shown in FIG. 2.
Figure 4B:
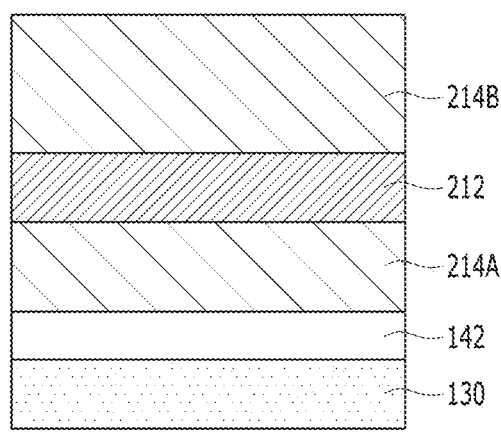
FIG. 4B is a cross-sectional view for explaining another example of a method for fabricating a second layer included in an interface enhancement layer shown in FIG. 2.

FIG. 4A is a cross-sectional view for explaining an example of a method for fabricating a second layer included in an interface enhancement layer as shown in FIG. 2. FIG. 4B is a cross-sectional view for explaining another example of a method for fabricating a second layer included in an interface enhancement layer as shown in FIG. 2.

Referring to FIG. 4A, a Co layer 212 may be deposited over the first layer 142 including the Fe-rich CoFeB formed over the tunnel barrier layer 130. Then, a CoFeB layer 214 may be deposited over the Co layer 212. Then, by performing a heat treatment, a Co-rich CoFeB alloy may be formed through a reaction of the Co layer 212 and the CoFeB layer 214. Here, a thickness of the Co layer 212 and a thickness of the CoFeB layer 214 may be controlled such that the Co content is equal to or more than about 35 at %, for example, about 40 at % or more.

A sequence of stacking the Co layer 212 and the CoFeB layer 214 may be reversed. For example, after forming the CoFeB layer 214, the Co layer 212 may be formed over the CoFeB layer 214.

Referring to FIG. 4B, a Co-rich CoFeB alloy may be formed by sequentially depositing a first CoFeB layer 214A, a Co layer 212 and a second CoFeB layer 214B over the first layer 142 including the Fe-rich CoFeB alloy formed over the tunnel barrier layer 130 and subsequently performing a heat treatment. Here, the sum of a thickness of the first CoFeB layer 214A and the second CoFeB layer 214B may be substantially the same as that of the CoFeB layer 214 shown in FIG. 4A.

In another implementation, although it is not shown, the Co-rich CoFeB alloy may be formed by performing a heat treatment after a plurality of CoFeB layers and a plurality of Co layers are alternately deposited.

In further another implementation, the Co-rich CoFeB alloy may be formed through a physical deposition process such as a sputtering process by using a CoFeB alloy target.

In still another implementation, the Co-rich CoFeB alloy may be formed through a physical deposition process such as a co-sputtering process by using two or more targets.

The metal layer 146 may be formed by depositing tantalum (Ta) over the second layer 144 including the Co-rich CoFeB (See, FIG. 2).

A semiconductor memory device based on the variable resistance element 100 including the interface enhancement layer 140 as disclosed in this document may include a cell array of such variable resistance element 100s to store data. The cell array may include various components such as lines, elements, etc. to drive or control each variable resistance element 100.

Figure 5:
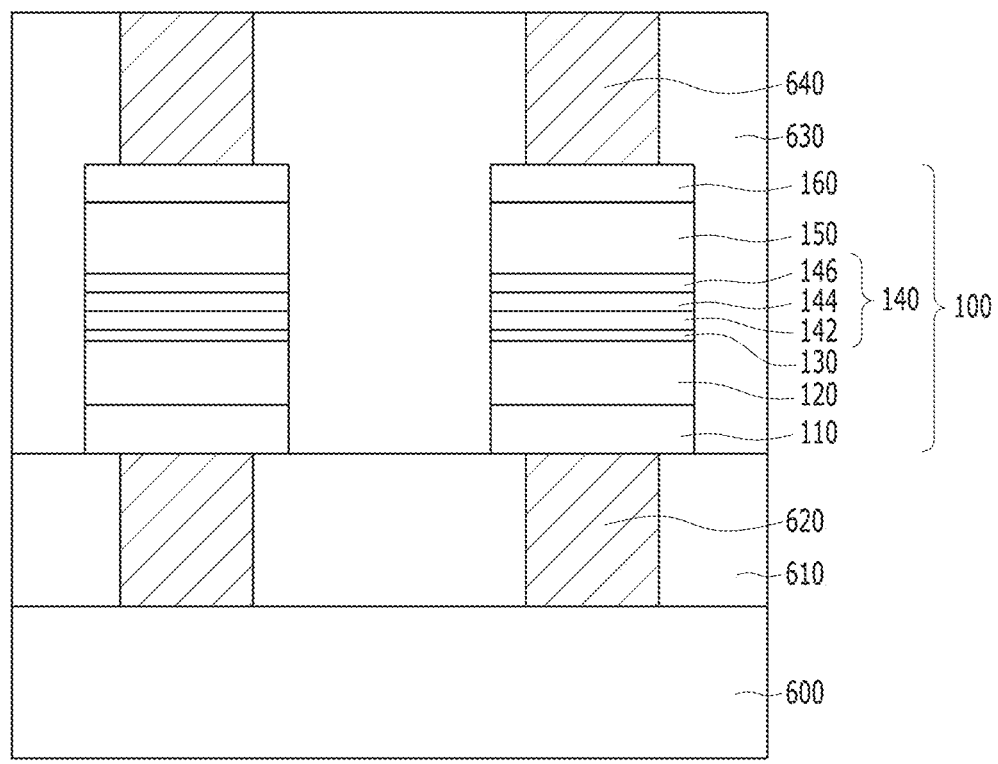
FIG. 5 is a cross-sectional view for explaining a memory device and a method for fabricating the same in accordance with an implementation of the present disclosure.

FIG. 5 is a cross-sectional view for explaining an example of a memory device with multiple variable resistance elements with the disclosed interface enhancement layer and a method for fabricating the same in accordance with an implementation of the present disclosure.

Referring to FIG. 5, the memory device of this implementation may include a substrate 600, lower contacts 620 formed over the substrate 600, variable resistance elements 100 formed over the substrate 600 and upper contacts 640 formed over the substrate 600. For each variable resistance element 100, a specific structure as a switch or switching circuit/element, for example, a transistor, for controlling an access to a particular variable resistance element 100 can be provided over the substrate 600 to control the variable resistance element 100, where the switch can be turned on to select the variable resistance element 100 or turned off to de-select the variable resistance element 100. The lower contact 620 may be disposed over the substrate 600, and couple a lower end of the variable resistance element 100 with a portion of the substrate 600, for example, a drain of the transistor as the switching circuit for the variable resistance element 100. The upper contact 640 may be disposed over the variable resistance element 100, and couple an upper end of the variable resistance element 100 with a certain line (not shown), for example, a bit line. In FIG. 5, two variable resistance elements 100 are shown as examples of the elements in an array of variable resistance elements 100.

The above memory device may be fabricated by following processes.

First, the substrate 600 in which the transistor is formed may be provided, and then, a first interlayer dielectric layer 610 may be formed over the substrate 300. Then, the lower contact 620 may be formed by selectively etching the first interlayer dielectric layer 610 to form a hole exposing a portion of the substrate 600 and filling the hole with a conductive material. Then, the variable resistance element 100 may be formed by forming material layers for the variable resistance element 100 over the first interlayer dielectric layer 610 and the lower contact 620, and selectively etching the material layers. The etching process for forming the variable resistance element 100 may include the IBE method which has a strong physical etching characteristic. Then, a second interlayer dielectric layer 630 may be formed to cover the variable resistance element. Then, the second interlayer dielectric layer 630 may be selectively etched to form a hole which exposes the top of the variable resistance element 100, and a conductive material may be buried in the hole so as to form the upper contact 640.

In the memory device in accordance with this implementation, all layers forming the variable resistance element 100 may have sidewalls which are aligned with each other. That is because the variable resistance element 100 is formed through an etching process using one mask.

Unlike the implementation of FIG. 5, a part of the variable resistance element 100 may be patterned separately from other parts. This process is illustrated in FIG. 6.

Figure 6:
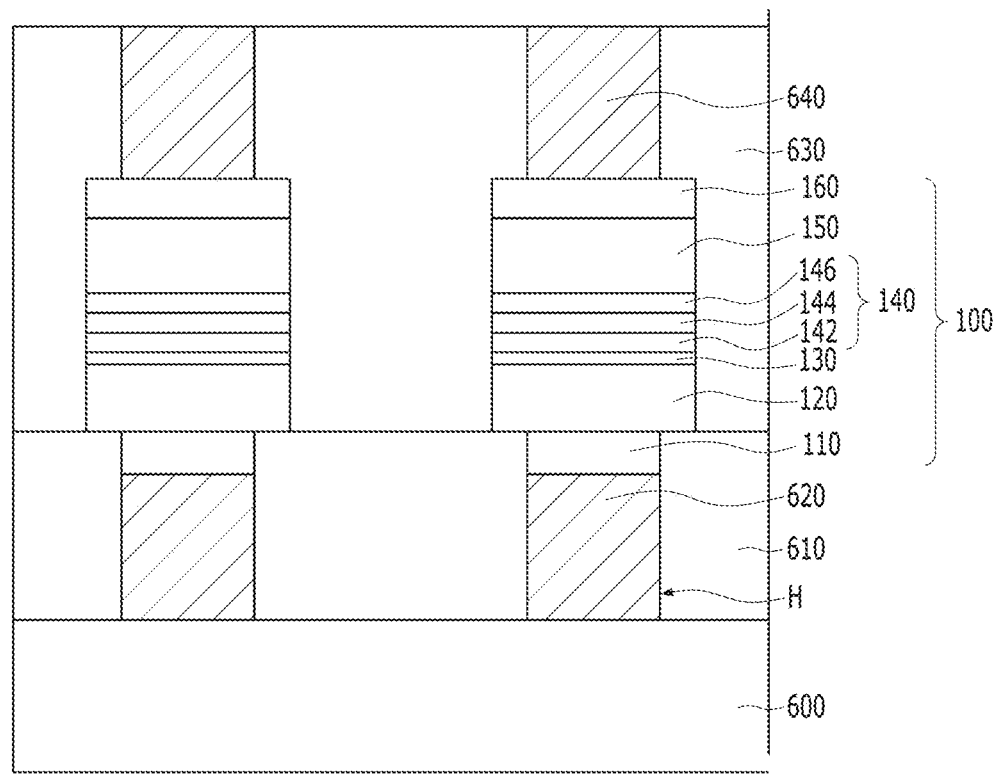
FIG. 6 is a cross-sectional view for explaining a memory device and a method for fabricating the same in accordance with another implementation of the present disclosure.

FIG. 6 is a cross-sectional view for explaining a memory device having variable resistance elements and a method for fabricating the same in accordance with an implementation of the present disclosure. The following descriptions will be focused on a difference from the implementation of FIG. 5 with respect to the under layer 110 for each variable resistance element 100 in the cell array.

Referring to FIG. 6, the memory device in accordance with this implementation may include a variable resistance element 100 of which parts, for example, the under layer 110 has sidewalls that are not aligned with the other layers thereof. As shown in FIG. 6, the under layer 110 may have sidewalls which are aligned with a lower contact 620.

The memory device in FIG. 6 may be fabricated by following processes.

First, a first interlayer dielectric layer 610 may be formed over a substrate 600, and then selectively etched to form a hole H which exposes a part of the substrate 600. Then, a lower contact 620 may be formed to fill the lower part of the hole H. More specifically, the lower contact 620 may be formed through a series of processes of forming a conductive material to cover the resultant structure having the hole H formed therein, and removing a part of the conductive material through an etch back process or the like until the conductive material has a desired thickness. Next, the under layer 110 may be formed to fill the other part of the hole H having the lower contact 620 formed therein. For example, the under layer 110 may be formed through a series of processes of forming a material layer including a light metal, etc. for the under layer 110 to cover the resultant structure in which the lower contact 620 is formed, and performing a planarization process, for example, a CMP (Chemical Mechanical Polishing) process until the top surface of the first interlayer dielectric layer 610 is exposed. Subsequently, material layers for forming the other layers of the variable resistance element 100 excluding the under layer 110 may be formed over the lower contact 620 and the first interlayer dielectric layer 610, and then selectively etched to form the other layers of the variable resistance element 100. The subsequent processes may be performed in substantially the same manner as described with reference to FIG. 5.

In this implementation, the height which needs to be etched at a time in order to form the variable resistance element 100 can be reduced, which makes it possible to lower the difficulty level of the etching process.

Although in this implementation, the under layer 110 is buried in the hole H, other parts such as the free layer 120, etc. may also be buried as needed.

The above and other memory circuits or semiconductor devices based on the disclosed technology can be used in a range of devices or systems. FIGS. 7-11 provide some examples of devices or systems that can implement the memory circuits disclosed herein.

Figure 7:
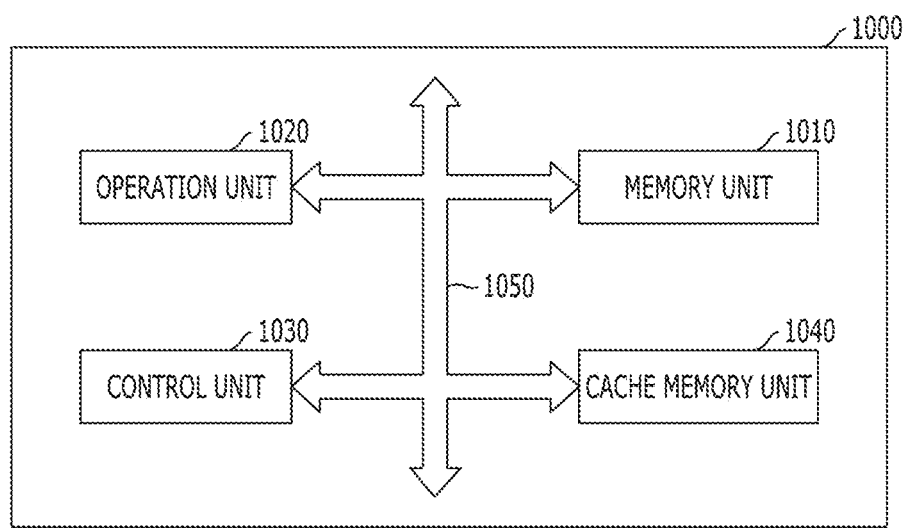
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a free layer having a variable magnetization direction; a pinned layer having a pinned magnetization direction; and a tunnel barrier layer interposed between the pinned layer and the free layer, and the free layer may include a free layer having a variable magnetization direction; a pinned layer having a pinned magnetization direction; a tunnel barrier layer interposed between the free layer and the pinned layer; and an interface enhancement layer interposed between the tunnel barrier layer and the pinned layer to include an electrically conductive multi-layer stack structure to enhance a magnetic characteristic of the semiconductor memory, wherein the interface enhancement layer may include an Fe-rich first layer; a Co-rich second layer formed over the first layer; and a metal layer formed over the second layer. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
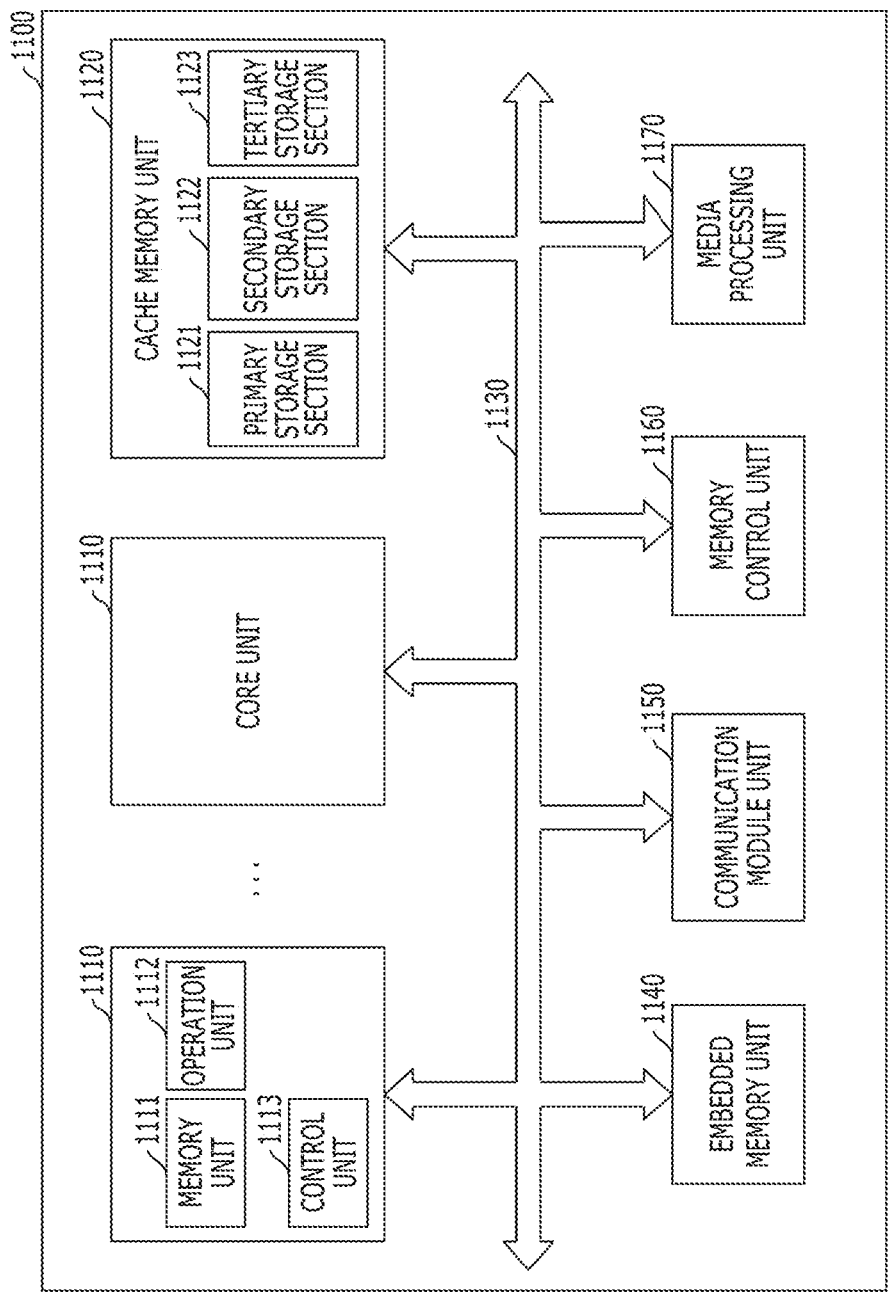
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a free layer having a variable magnetization direction; a pinned layer having a pinned magnetization direction; a tunnel barrier layer interposed between the free layer and the pinned layer; and an interface enhancement layer interposed between the tunnel barrier layer and the pinned layer to include an electrically conductive multi-layer stack structure to enhance a magnetic characteristic of the semiconductor memory, wherein the interface enhancement layer may include an Fe-rich first layer; a Co-rich second layer formed over the first layer; and a metal layer formed over the second layer. Through this, data storage characteristics of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MIVIC), an embedded MIVIC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
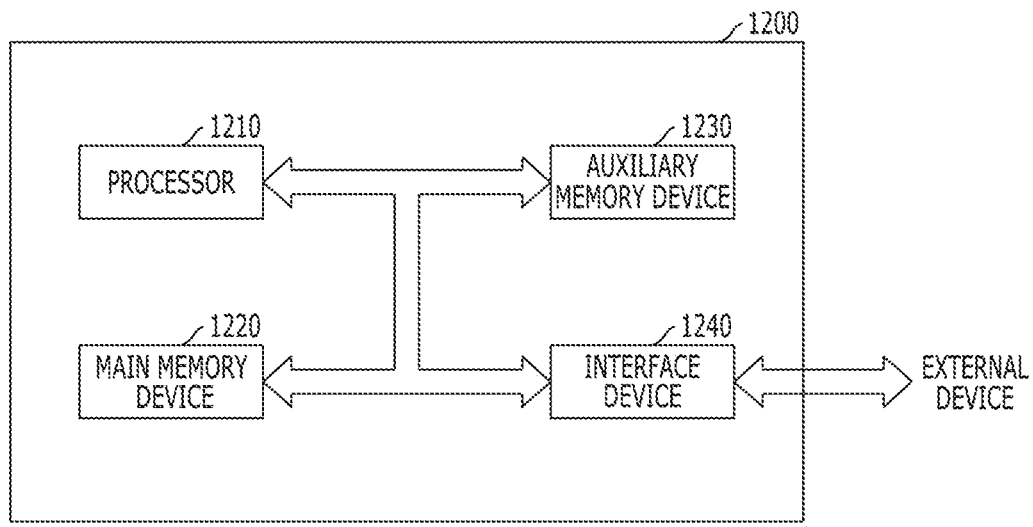
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a free layer having a variable magnetization direction; a pinned layer having a pinned magnetization direction; a tunnel barrier layer interposed between the free layer and the pinned layer; and an interface enhancement layer interposed between the tunnel barrier layer and the pinned layer to include an electrically conductive multi-layer stack structure to enhance a magnetic characteristic of the semiconductor memory, wherein the interface enhancement layer may include an Fe-rich first layer; a Co-rich second layer formed over the first layer; and a metal layer formed over the second layer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a free layer having a variable magnetization direction; a pinned layer having a pinned magnetization direction;

a tunnel barrier layer interposed between the free layer and the pinned layer; and an interface enhancement layer interposed between the tunnel barrier layer and the pinned layer to include an electrically conductive multi-layer stack structure to enhance a magnetic characteristic of the semiconductor memory, wherein the interface enhancement layer may include an Fe-rich first layer; a Co-rich second layer formed over the first layer; and a metal layer formed over the second layer. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
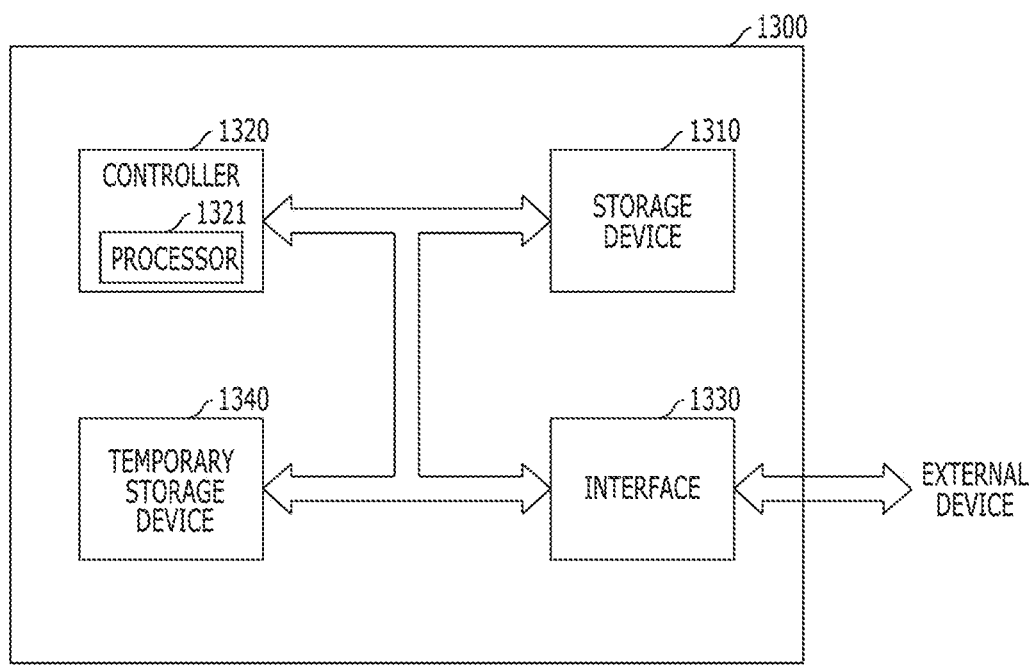
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a free layer having a variable magnetization direction; a pinned layer having a pinned magnetization direction; a tunnel barrier layer interposed between the free layer and the pinned layer; and an interface enhancement layer interposed between the tunnel barrier layer and the pinned layer to include an electrically conductive multi-layer stack structure to enhance a magnetic characteristic of the semiconductor memory, wherein the interface enhancement layer may include an Fe-rich first layer; a Co-rich second layer formed over the first layer; and a metal layer formed over the second layer. Through this, data storage characteristics of the storage device 1310 or the temporary storage device 1340 may be improved. As a consequence, operating characteristics and data storage characteristics of the data storage system 1300 may be improved.

Figure 11:
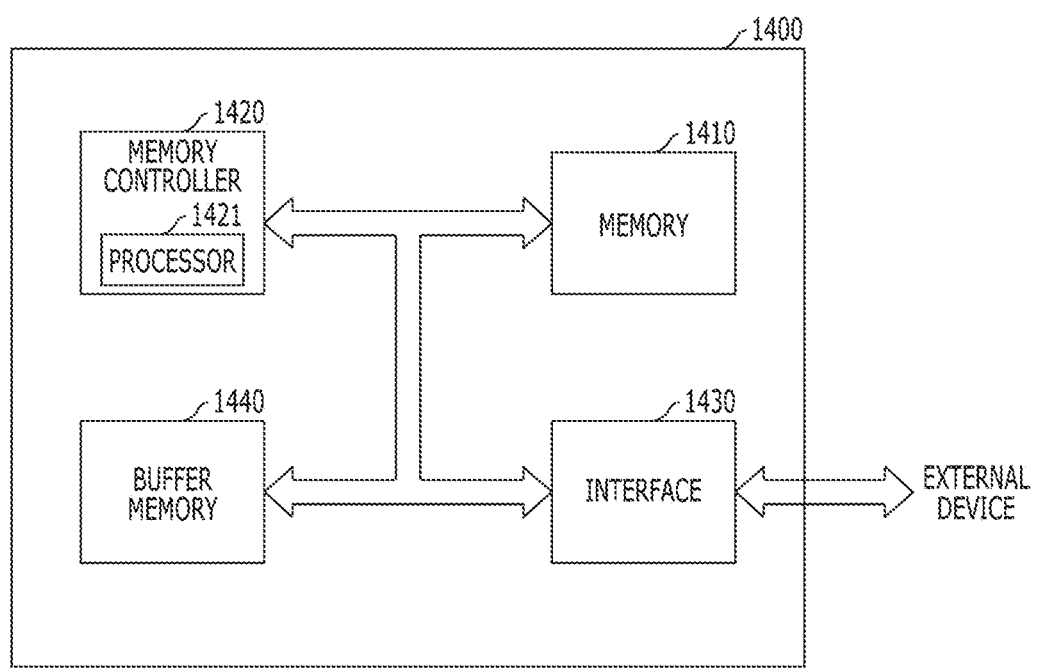
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a free layer having a variable magnetization direction; a pinned layer having a pinned magnetization direction; a tunnel barrier layer interposed between the free layer and the pinned layer; and an interface enhancement layer interposed between the tunnel barrier layer and the pinned layer to include an electrically conductive multi-layer stack structure to enhance a magnetic characteristic of the semiconductor memory, wherein the interface enhancement layer may include an Fe-rich first layer; a Co-rich second layer formed over the first layer; and a metal layer formed over the second layer. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a free layer having a variable magnetization direction; a pinned layer having a pinned magnetization direction; a tunnel barrier layer interposed between the free layer and the pinned layer; and an interface enhancement layer interposed between the tunnel barrier layer and the pinned layer to include an electrically conductive multi-layer stack structure to enhance a magnetic characteristic of the semiconductor memory, wherein the interface enhancement layer may include an Fe-rich first layer; a Co-rich second layer formed over the first layer; and a metal layer formed over the second layer. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory for storing data, wherein the semiconductor memory includes:
   a free layer having a variable magnetization direction;
   a pinned layer having a pinned magnetization direction;
   a tunnel barrier layer interposed between the free layer and the pinned layer; and
   an interface enhancement layer interposed between the tunnel barrier layer and the pinned layer,
   wherein the interface enhancement layer includes:
   an Fe-rich first layer including boron (B);
   a Co-rich second layer formed over the first layer and including boron (B); and
   a metal layer formed over the Co-rich second layer and including tantalum (Ta), the metal layer structured to improve a crystal growth in the pinned layer and suppress boron diffusion from the Fe-rich first layer and the Co-rich second layer,
   wherein the Fe-rich first layer and the Co-rich second layer further include a non-magnetic material, the non-magnetic material including one or more of zirconium (Zr), niobium (Nb), molybdenum (Mo), ruthenium (Ru), titanium (Ti), hafnium (Hf), vanadium (V), chromium (Cr), aluminum (Al), iridium (Ir) or rhodium (Rh).

2. The electronic device of claim 1, wherein the Fe-rich first layer includes an Fe-rich CoFeB alloy.

3. The electronic device of claim 2, wherein the Fe-rich CoFeB alloy includes an Fe content equal to or more than 35 at %.

4. The electronic device of claim 1, wherein the Co-rich second layer includes a Co-rich CoFeB alloy.

5. The electronic device of claim 4, wherein the Co-rich CoFeB alloy includes a Co content equal to or more than 35 at %.

6. The electronic device according to claim 1, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and the outside,
   wherein the semiconductor memory is part of the auxiliary memory device or the main memory device in the processing system.

7. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory is part of the storage device or the temporary storage device in the data storage system.

8. The electronic device according to claim 1, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory is part of the memory or the buffer memory in the memory system.

9. An electronic device comprising a semiconductor memory, wherein the semiconductor memory includes:
   a substrate;
   memory cells formed over the substrate, each memory cell including a magnetic layer and an interface enhancement layer that is in contact with the magnetic layer to enhance a magnetic characteristic of the magnetic layer; and
   switching elements formed over the substrate and coupled to the memory cells, respectively, to select or de-select the memory cells,
   wherein the interface enhancement layer of each memory cell includes:
   an Fe-rich first layer including boron (B);
   a Co-rich second layer formed over the Fe-rich first layer and including boron (B); and
   a metal layer formed over the Co-rich second layer and including tantalum (Ta), the metal layer structured to improve a crystal growth in the pinned layer and suppress boron diffusion from the Fe-rich first layer and the Co-rich second layer,
   wherein the Fe-rich first layer and the Co-rich second layer further include a non-magnetic material, the non-magnetic material including one or more of zirconium (Zr), niobium (Nb), molybdenum (Mo), ruthenium (Ru), titanium (Ti), hafnium (Hf), vanadium (V), chromium (Cr), aluminum (Al), iridium (Ir) or rhodium (Rh).

10. The electronic device of claim 9, wherein each memory cell includes a magnetic tunnel junction structure that includes the magnetic layer and the interface enhancement layer.

11. The electronic device of claim 9, wherein the Fe-rich first layer includes an Fe-rich CoFeB alloy.

12. The electronic device of claim 9, wherein the Fe-rich CoFeB alloy includes an Fe content equal to or more than 35 at %.

13. The electronic device of claim 9, wherein the Co-rich second layer includes a Co-rich CoFeB alloy.

14. The electronic device of claim 13, wherein the Co-rich CoFeB alloy includes a Co content equal to or more than 35 at %.

15. The electronic device of claim 9, wherein the metal layer includes tantalum (Ta).

* * * * *